US011268985B2

(12) United States Patent
Barthel

(10) Patent No.: US 11,268,985 B2
(45) Date of Patent: Mar. 8, 2022

(54) MEASUREMENT APPARATUS AND MEASUREMENT METHOD

(71) Applicant: Rohde & Schwarz GmbH & Co. KG, Munich (DE)

(72) Inventor: Sven Barthel, Chemnitz (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 156 days.

(21) Appl. No.: 16/397,132

(22) Filed: Apr. 29, 2019

(65) Prior Publication Data
US 2020/0341033 A1 Oct. 29, 2020

(51) Int. Cl.
*G01R 13/02* (2006.01)
(52) U.S. Cl.
CPC ............... *G01R 13/0254* (2013.01)
(58) Field of Classification Search
CPC ........ G01R 13/0254; G01R 13/0218; G01R 13/02; G01R 13/00
See application file for complete search history.

(56) References Cited

U.S. PATENT DOCUMENTS

| | | | | |
|---|---|---|---|---|
| 5,517,105 A | * | 5/1996 | Holzwarth | G01R 13/30 324/121 R |
| 5,579,463 A | * | 11/1996 | Takano | G01R 13/345 345/440 |
| 2002/0080149 A1 | * | 6/2002 | Alexander | G01R 13/345 345/634 |
| 2003/0218612 A1 | | 11/2003 | Dobyns | |
| 2006/0055698 A1 | * | 3/2006 | Ritter | G01R 13/02 345/440.1 |
| 2007/0273694 A1 | * | 11/2007 | Dobyns | G01R 13/02 345/440.1 |
| 2014/0215379 A1 | * | 7/2014 | Purdy | G06F 3/0481 715/781 |
| 2014/0320145 A1 | * | 10/2014 | Johnson | G01R 13/0236 324/436 |
| 2017/0285902 A1 | * | 10/2017 | Patel | G06F 3/0486 |

* cited by examiner

*Primary Examiner* — Mohamed Charioui
(74) *Attorney, Agent, or Firm* — Westman, Champlin & Koehler, P.A.

(57) ABSTRACT

An improved zooming for a representation of a measurement signal is provided. Two views for an acquired measurement signal are generated. A first view provides an overview of the acquired measurement signal, and a second view provides a horizontally zoomed section of the acquired measurement signal. The zoom window of the zoomed view is automatically set such that a predetermined number of periods are covered by the zoomed view.

16 Claims, 3 Drawing Sheets

MEASUREMENT APPARATUS AND MEASUREMENT METHOD

TECHNICAL FIELD

The present invention relates to a measurement apparatus. The present invention further relates to a measurement method.

BACKGROUND

Although applicable in principle to any measurement system, the present invention and its underlying problem will be hereinafter described in combination with an oscilloscope.

Measurement devices such as an oscilloscope may be used for measuring a number of one or more signals and providing a waveform of the measured signals to a user. After providing an overview of the measured signal to the user, a user may zoom the provided waveform at a specific position. For this purpose, the user may determine a zoom window specifying an area of interest of the provided overview of the measured signal.

However, when having high zoom factors, it might be very difficult to precisely specify a point of interest and a corresponding zoom window. Thus, a user may require multiple attempts in order to specify the desired position which shall be zoomed. For example, a user may tap on a touch screen in order to roughly specify the desired position on a provided overview of the measurement signal. Afterwards, the user may further specify the desired position by means of additional input elements such as a rotary knob or numerical inputs to re-adjust the selected position. Thus, specifying a desired zoom window of a measured signal may be a complex and time consuming task.

Against this background, there is a need to provide a simplified selection of an appropriate zoom window in order to process a zooming of a measured signal. In particular, there is a need for an improved and at least partly automated selection of an appropriate zoom window when measuring signals.

SUMMARY

The present invention provides a measurement apparatus and a measurement method with the features of the independent claims. Further advantageous embodiments are subject matter of the dependent claims.

According to a first aspect, a measurement apparatus is provided. The measurement apparatus comprises a measurement device and a processing device. The measurement device is configured to acquire a measurement signal. The processing device is configured to generate a first view and a second view. The first view may represent an overview of the acquired measurement signal. The second view may represent a horizontally zoomed section of the acquired measurement signal. The processing device is further configured to determine a periodicity of the acquired measurement signal. Based on the determined periodicity, the processing device is configured to generate a second view including a predetermined number of periods of the acquired measurement signal. In particular, the second view may comprise a predetermined number of periods at a specific position of the acquired measurement signal.

According to a further aspect, a measurement method is provided. The measurement method comprises acquiring a measurement signal. The acquiring of the measurement signal may be performed by a measurement device. The method further comprises generating a first view representing an overview of the acquired measurement signal. Further, the method comprises determining a periodicity of the acquired measurement signal and generating a second view representing a horizontally zoomed section of the acquired measurement signal. The second view may comprise a representation including a predetermined number of periods of the acquired measurement signal. In particular, the second view may comprise a predetermined number of periods at a specific position of the acquired measurement signal.

The present invention is based on the finding that a precise specification of a desired zoom window for zooming a measurement signal may be a complex and time consuming task. In particular, when zooming the measurement signal with a high zoom factor, the position and the width of the zooming has to be specified very precisely.

The present invention therefore provides an automated assistance for specifying appropriate zoom parameters. In particular, a horizontal zooming of an acquired measurement signal is provided such that a view of the zoomed measurement signal provides an appropriate horizontal zooming.

It is for this purpose that the horizontal zooming of the acquired measurement signal is set such that the generated view of the zoomed measurement signal comprises a predetermined number of periods of a periodic signal. In this way, a view of the zoomed measurement signal is provided which makes it possible to precisely analyze the measurement signal at the specific horizontal position. By automatically setting the parameters of the horizontal zooming in an appropriate manner, the visualization of the zoomed measurement signal is improved and the required time for configuring the measurement device is minimized. Thus, by assisting the user for setting the zoom parameters accordingly, the time for performing the measurement operation can be reduced. Furthermore, the measurement results may be also improved by an enhanced visualization of the zoomed measurement signal.

The measurement apparatus may be any kind of measurement apparatus for measuring a number of one or more signals, in particular electronic signals. For example, the measurement apparatus may be an oscilloscope. However, any other kind of measurement apparatus acquiring two-dimensional signals may be also possible.

The measurement apparatus may measure any kind of electric signal, in particular electric signals comprising a signal component having a periodicity. The measurement signal may be also a non-periodic signal which may be overlaid with a further signal, e.g. a disturbance or the like, having a periodicity.

The term "periodicity" in this context may be considered as any kind of signal or signal component having a repetitive character. For example, a periodic signal component may be a sinusoidal, rectangular, triangular, etc. signal component. Furthermore, the periodic signal may be any other kind of signal with a characteristic repetitive element, for example a peak, a rising or falling edge, etc.

The measurement device of the measurement apparatus may receive the measurement signal and process the received measurement signal for a further analysis. For example, the measurement apparatus may comprise elements such as an amplifier, an attenuator, filter elements, etc. The measurement apparatus may also comprise an analog to digital converter for digitizing a received analog signal to digital data. The analog to digital converter may digitize the received measurement signal with a predetermined sampling rate, resolution, etc. Furthermore, the digitized data may be stored in a measurement apparatus for further analysis.

The analysis of the acquired measurement signal may be performed, for example, by providing a graphical representation of the acquired measurement signal. For this purpose, a view of the signal waveform of the acquired measurement signal may be provided to a user. For this purpose, the acquired measurement signal may be processed by the processing device of the measurement apparatus. For example, the processing device may generate a first view representing an overview of the whole acquired measurement signal. For example, the overview may represent a signal waveform of the acquired measurement signal for a specific period of time. The acquisition of the measurement signal may be started when a predetermined trigger event is detected. After detecting the specific trigger event, the acquisition of the measurement signal may be performed for a predetermined period of time. Furthermore, it may be even possible to acquire measurement data relating to a specific period of time before the trigger event occurs. However, any other scheme for acquiring the measurement signal may be also possible.

The processing device may receive the measurement signal from the measurement device. For example, the processing device may receive digital data corresponding to the measurement signal received by the measurement device and digitized by the measurement device. Furthermore, it may be possible that the measurement device may store the data of the acquired measurement signal in a memory, and the processing device reads the data corresponding to the measurement signal from the memory.

The processing device may generate at least to views based on the acquired measurement signal. A first view may represent an overview of the acquired measurement signal, in particular an overview corresponding to a specific period of time. The first view may provide a representation of a signal waveform of the measurement signal. The processing device may further generate a second view representing a zoomed section of the acquired measurement signal. The second view may represent a section of the acquired measurement signal which is zoomed at least in horizontal direction, i.e. in a direction of an x-axis. For example, this horizontal direction (x-axis) may relate to a time-axis. The position of the zoomed sequence within the acquired measurement signal may be specified by a user. However, it may be also possible that the position in horizontal direction for zooming the measurement signal may be also specified in any other manner, for example based on an algorithm or the like. Furthermore, a width or length of the section which shall be zoomed for the second view may be automatically determined by the processing device.

For this purpose, the processing device may analyze the acquired measurement signal at the specified position in order to determine appropriate parameters for zooming the acquired measurement signal. In particular, the processing device may analyze the acquired measurement signal in order to determine a periodicity or frequency of the acquired measurement signal. As already mentioned before, such a periodicity or frequency may relate to a frequency of a sinusoidal, rectangular or triangular shaped waveform of the measurement signal. Furthermore, any other characteristic properties having a repetitive character may be identified in the acquired measurement signal in order to determine a periodicity or frequency. The periodicity or frequency may relate to the "whole" measurement signal. However, it may be also possible to identify a modulation, a disturbance or any other overlaid signal which may provide a repetitive character for determining the periodicity or frequency.

Based on the determined periodicity in the acquired measurement signal, the processing device may set a width of a zoom window for zooming the acquired measurement signal such that a predetermined number of periods may be included within the zoom window in horizontal direction. For example, a number of two, three, four, five or more periods may be included in the horizontal direction of the zoom window for zooming the acquired measurement signal. It is understood that any other number of periods may be also included in the zoom window. For this purpose, a horizontal zoom factor may be set such that the desired number of periods may be included in a predetermined width of the second view. Alternatively, it may also possible that a specific zoom factor is used or a specific zoom factor out of a predetermined set of zoom factors is selected, and the width of the second view is further adapted such that the desired number of periods may be included in the second view.

The processing device may comprise, for example, a number of one or more general purpose processors with corresponding instructions. Furthermore, the processing unit may comprise a memory for providing instructions which may be executed by a processor to perform the desired operations. The processor may further execute an operating system that loads and executes the instructions. The processor may be, for example, an Intel processor that runs a Windows or Linux operating system that loads and executes the instructions. Furthermore, the processor may be processor that runs an embedded operating system for loading and executing the respective instructions.

Further embodiments of the present invention are subject of further subclaims and of the following description, referring to the drawings.

In a possible embodiment, the measurement apparatus may comprise a display. The display may be configured to display the first view and the second view.

For example, the display may be a monochrome or colored display. The display may be, for example, a TFT display, an OLED display or any other kind of appropriate display. Accordingly, the display may be controlled by the processing unit for displaying the generated views. In particular, the first view may be displayed, for example, in a first window and the second view may be displayed in a second window. Additionally, any kind of further information may be displayed as graphical representation and/or alphanumeric information.

In a possible embodiment, the measurement apparatus may comprise an input device. The input device may be configured to receive an indication specifying a horizontal position of the second view within the acquired measurement signal.

For example, the indication for specifying the horizontal position may be received by a touch display, in particular a touch display displaying the first view. Thus, a user may select the desired position by pointing to the respective position on the first view. Furthermore, it may be possible to move around a cursor on the representation of the acquired measurement signal, in particular on the waveform of the acquired signal provided by the first view, by means of a rotary knob or any other kind of input device, for example keys, etc.

In a possible embodiment, the second view may have a predetermined horizontal width. The processing device may be configured to adapt a horizontal zoom factor based on the predetermined width of the second view. Furthermore, the processing device may take into account the desired predetermined number of periods which shall be displayed in the second view.

In this way, the scaling for zooming the acquired measurement signal in horizontal direction may be adapted by setting the horizontal zoom factor accordingly. In this way, the width of the second view is always kept constant.

In a possible embodiment, the processing device is configured to dynamically adapt the width of the second representation based on the periodicity of the acquired measurement signal. Furthermore, the zoom factor may be kept constant or selected out of a number of predetermined zoom factors.

By selecting an appropriate zoom factor out of a number of predetermined zoom factors, it may be easier for a user to recognize the applied zoom factor. Furthermore, by adapting the width of the second view such that the desired number of periods may be included in the second view, the user is always aware about the periodicity or frequency of the zoomed signal.

In a possible embodiment, the processing device is configured to continuously adapt the setting for applying the horizontal zooming of the second view.

By continuously adapting the setting of the second view, the second view may be continuously adapted even if the properties of the measured signal changes, in particular the periodicity in the measured signal changes.

In a possible embodiment, the processing device is configured to adapt the setting of the second view when a position of the zoomed section of the input signal changes.

For example, the setting of the second view, in particular the determination of the periodicity and the applied zooming may be reconfigured, each time when a user selects another position within the acquired measurement signal for zooming.

In a possible embodiment, the measurement device may be configured to acquire a further measurement signal. Alternatively, the measurement signal may be configured to derive a further measurement signal from the acquired measurement signal. The processing device may be further configured to generate a further view representing a horizontally zoomed section of the further measurement signal. The zooming of the further view may correspond to the horizontal zooming of the second view.

Accordingly, the acquired or derived further signal may be horizontally zoomed equal to the zooming which is applied to the second view. Furthermore, it may be also possible to generate and provide a view representing an overview of the further measurement signal.

With the present invention it is therefore now possible to automatically provide an improved horizontal zooming of an acquired measurement signal. In particular, a width of a zoom window for horizontally zooming the acquired measurement signal may be set such that a predetermined number of periods may be provided in the zoomed representation of the acquired measurement signal. In this way, the configuration of the measurement signal for providing the zoomed representation can be simplified and accelerated. Accordingly, the whole measurement procedure for analyzing an acquired measurement signal can be improved.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
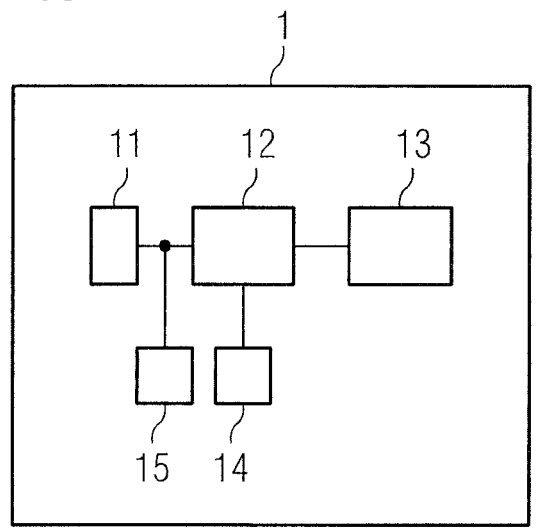
FIG. 1: shows a block diagram of an embodiment of a measurement apparatus according to an embodiment.

The appended drawings are intended to provide further understanding of the embodiments of the invention. They illustrate embodiments and, in conjunction with the description, help to explain principles and concepts of the invention. Other embodiments and may of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DETAILED DESCRIPTION OF THE DRAWINGS

FIG. 1 shows a block diagram of a measurement apparatus 1 according to an embodiment. The measurement apparatus 1 comprises a measurement device 11 and a processing device 12. The measurement device 1 may further comprise a display 13. Furthermore, the measurement apparatus 1 may comprise an input device 14. However, it is understood that the measurement apparatus 1 may also comprise any other appropriate device for performing a desired measurement operation.

Measurement device 11 of measurement apparatus 1 may receive a number of one or more measurement signals. For example, measurement device 11 may comprise a number of one or more input terminals. Each input terminal may be connected with a corresponding signal source. For example, an input terminal may be connected with a measurement point of a device under test. Measurement device 11 may be also connected with a measurement antenna for receiving wireless signals. The received one or more signals may be acquired by measurement device 11. For this purpose, an analog signal may be converted to corresponding digital measurement data by means of an analog to digital converter. Furthermore, measurement device 11 may comprise additional components such as an amplifier, an attenuator, a filter or the like.

The acquired measurement signal, in particular the digital data of a measurement signal may be provided to processing device 12. Additionally, or alternatively, the data of the acquired measurement signal may be stored in a measurement memory 15. For example, the acquisition of the measurement signal, the analog to digital conversion and/or the storing of the measurement data in memory 15 may be synchronized with a detection of a predetermined trigger event.

The acquired measurement signal may be further analyzed. For this purpose, a graphical representation of a signal waveform of the acquired measurement signal may be generated. The generated representation may be provided to a user. For example, the graphical representation of the signal waveform may be displayed on display 13. However, it may be also possible to print or plot the graphical representation or store the graphical representation in any appropriate manner.

For providing a graphical representation of the acquired measurement signal, a first view may be generated. The first view may represent an overview of the acquired measurement signal. For example, the acquired measurement signal may comprise a measurement signal of a predetermined period of time. Accordingly, the overview of the first view may comprise a representation of the signal waveform for the whole predetermined period of time. However, it may be also possible that only a part of the period of time may be provided by the overview in the generated first view.

As it may be rather difficult to identify details of the signal waveform in the generated first view, a second view may be generated. The second view may provide a horizontally zoomed section of the acquired measurement signal. In particular, a zoom window may be specified. The zoom window may specify at least a start position and an end position of a section which shall be horizontally zoomed. Alternatively, the zoom window may be also specified, for example, by a start position and a width of the zoom window. Any other characteristic for specifying a section of the acquired measurement signal which should be horizontally zoomed may be also possible.

The required parameters for specifying the zoom window may be entered, for example by input device 14. For example, input device 14 may comprise a rotary knob or keys for moving around a cursor on the first view. In particular, the first view may be displayed on a display 13, and a cursor may be overlaid on the first view for navigating through the overview of the acquired measurement signal in horizontal direction. Furthermore, it may be possible to specify a desired position of the cursor (and the corresponding zoom window) by means of a touch display.

Processing device 12 may further determine an appropriate width of the zoom window. In particular, the processing device 12 may adapt the zoom window based on repetitive properties of the acquired measurement signal. In particular, processing device 12 may analyze the acquired measurement signal at the position which shall be horizontally zoomed. For this purpose, processing device 12 may determine a periodicity or a corresponding frequency of the acquired measurement signal. The periodicity may be determined based on any appropriate repetitive characteristics in the measurement signal. For example, sinusoidal elements of the acquired measurement signal may be identified. It may be also possible to identify rectangular, triangular or any other periodical components in the acquired measurement signal. Furthermore, the repetitive elements may be also rising or falling edges, pulses or the like. However, it is understood that any other element which may be used as an indication for a repetition may be also possible. Based on the identified repetitive elements in the acquired measurement signal, a periodicity and accordingly a periodic length may be determined. This periodic length may be used as a basis for configuring the width of the zoom window. For example, the zoom window may be set such that a predetermined number of periods may be covered by the zoom window. For example, the zoom window may comprise one, two, three, four, five, . . . periods of the identified periodicity. However, any other number of periods may be also used as a basis for setting the width of the zoom window. The number of periods which shall be covered by the zoom window may be a predetermined fixed number. However, it may be also possible that the number of periods for the zoom window may be variable. For example, a user may enter the desired number of periods in the zoom window by input device 14 or another appropriate device. Any other manner for specifying the desired number of periods of the zoom window may be also possible.

After specifying the start position of the zoom window, for example by means of a cursor in the first view, and by automatically determining the width of the zoom window based on the periodicity and the desired number of periods, processing device 12 may generate the second view of the horizontally zoomed section of the acquired measurement signal which provides a zoomed representation of the measurement signal within the zoom window.

Although it has been previously described that the zoom window may be specified by a start position and a width covering a predetermined number of periods, it may be also possible to specify and end position or a middle position and to set the zoom window accordingly. For example, it may be also possible to set the zoom window such that a first number of periods before the specified position and a second number of periods after the specified position is covered by the zoom window. Alternatively, it may be also possible to cover a predetermined number of periods before the specified position.

If the second view shall have a predetermined width, a zoom factor may be computed such that the desired width of the second view may be fully covered by the predetermined number of periods of the acquired measurement signal. Alternatively, it may be also possible to apply one of a number of predetermined zoom factors and to adapt the width of the second view accordingly. For example, it may be possible to apply a zoom factor being a power of 10 or the like. Accordingly, a zoom factor may be selected which can provide the desired number of periods within the second view. However, it is understood that any other manner for applying a zooming of the acquired measurement signal such that the desired number of periods is covered by the second view may be also possible.

Figure 2:
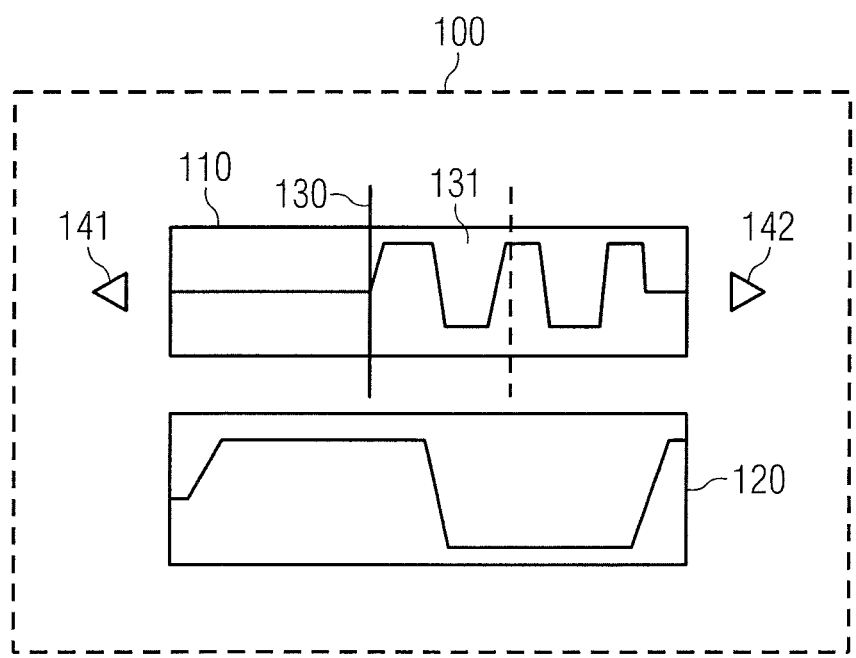
FIG. 2: shows a diagram illustrating a representation of the views generated by a measurement apparatus according to an embodiment.

FIG. 2 shows a schematic illustration of a representation comprising a first view and a second view generated by a measurement apparatus according to an embodiment. The representation 100 may comprise a first view 110 representing an overview of the acquired measurement signal. A cursor 130 may be moved in horizontal direction along the first view in order to specify a desired position which shall be zoomed in horizontal direction. Furthermore, the applied zoom window 131 may be also indicated in the first view. Optionally, soft keys 141, 142 may be provided for moving the cursor 130. Additionally, or alternatively, the cursor 130 may be also positioned by a tap on a touch screen.

The representation 100 may further comprise a representation 120 of a second view. As can be seen, the second view may provide a horizontally zoomed representation of the selected zoom window. The zoom factor is set such that a predetermined number, for example three periods, may be covered by the second view. Optionally, it may be also possible to apply a vertical zooming of the measurement signal in the second view. The vertical zooming may be applied automatically or based on manually specified parameters.

Figure 3:
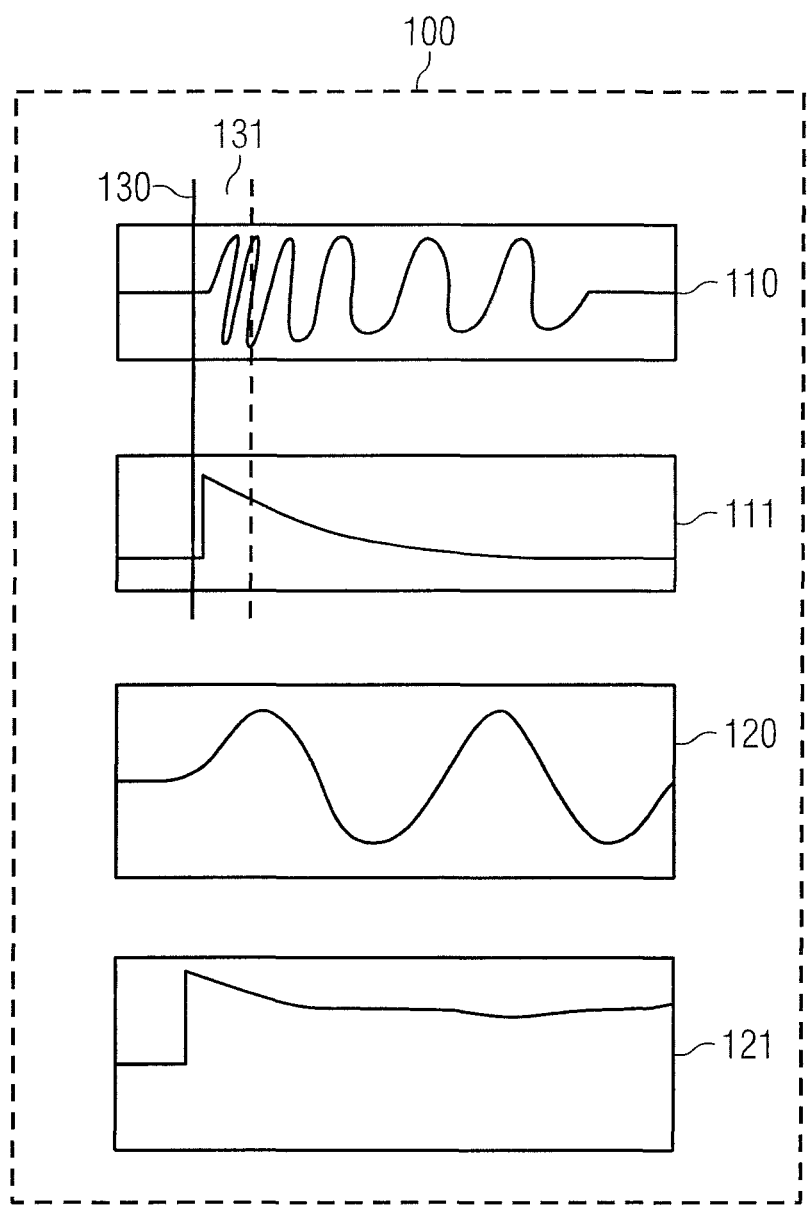
FIG. 3: shows an illustration of further views generated by a measurement apparatus according to an embodiment.

FIG. 3 shows an alternative representation 100 generated by a measurement apparatus 1 according to an embodiment. As can be seen in FIG. 3, further to the first view 110 of the acquired measurement signal, an additional overview 111 of a further measurement signal is provided. The additional measurement signal may be a further measurement signal acquired by measurement device 11. Additionally, or alternatively, it may be also possible to derive a further signal based on the acquired measurement signal.

For example, the further signal may be derived by applying a demodulation or any other operation on the acquired measurement signal.

Accordingly, in addition to the horizontally zoomed measurement signal in the second view 120, a corresponding horizontal zooming 121 of the further signal may be provided. For this purpose, a same zoom factor may be applied to the acquired measurement signal and the further signal.

Figure 4:
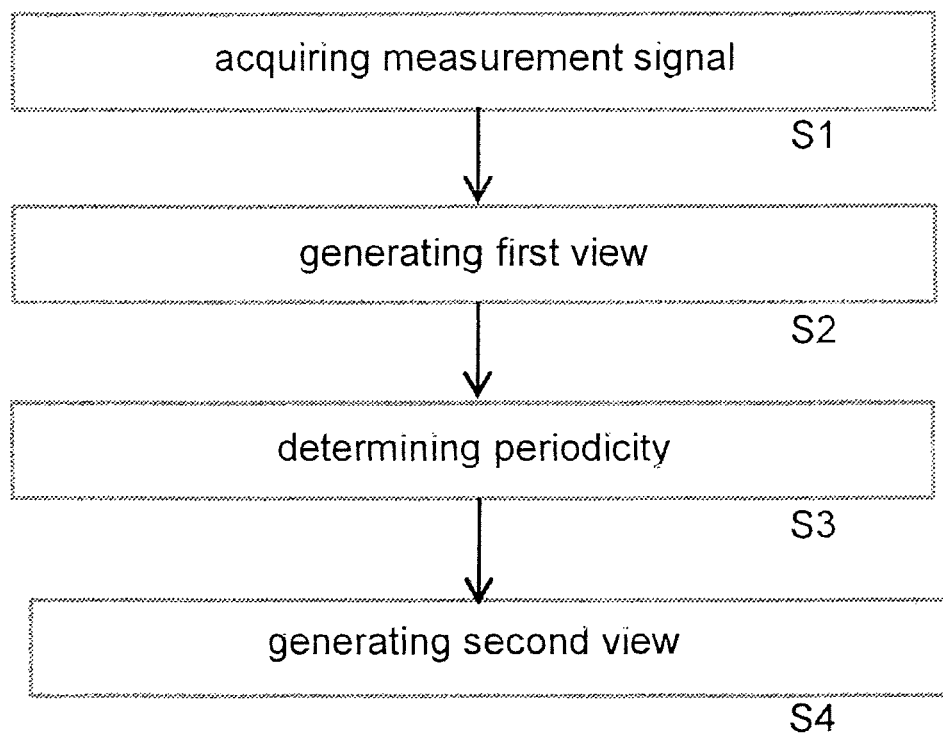
FIG. 4: shows a flow diagram of a measurement method according to an embodiment.

FIG. 4 shows a flow diagram of a measurement method according to an embodiment. The measurement method may comprise all steps as described above in connection with measurement apparatus 1. Accordingly, measurement apparatus 1 may also apply any kind of operation as described below in connection with the measurement method.

In a first step S1, a measurement signal is acquired. The measurement signal may be acquired by a measurement device 10. In step S2, a first view is generated. The first view represents an overview of the acquired measurement signal. In step S3, a periodicity of the acquired measurement signal is determined. In particular, a periodicity of the measurement signal at a specified position is determined. In step S4, a second view is generated. The second view may represent a horizontally zoomed section of the acquired measurement signal. In particular, the horizontally zooming is applied to the specified position. The second view may comprise a representation including a predetermined number of periods of the acquired measurement signal. The generation of the first view and the second view and the determination of the periodicity may be performed by processing device 12.

The method may further comprise displaying the first view and the second view on a display.

The method may comprise receiving an indication for specifying a horizontal position of the second view within the acquired measurement signal. Accordingly, the horizontally zooming may be performed at the received indication of the horizontal position.

The second view may have a predetermined horizontal width. Accordingly, the method may adapt a horizontal zoom factor based on the predetermined width. In particular, the zoom factor may be applied such that the desired number of periods may be covered by the width of the second view. The method may dynamically adapt the width of the second view based on the determined periodicity of the acquired measurement signal. Alternatively, the method may adapt a vertical zoom of the second view based on a range of values in the zoomed section of the measurement signal.

The method may continuously adapt the setting of the second view, in particular the zoom window for applying the horizontal zooming.

The method may comprise a step of adapting a setting of the second view when a position of the zoomed section of the input signal changes. For example, the setting may be adapted each time, when another position within the acquired measurement signal shall be horizontally zoomed.

The method may further comprise acquiring a further measurement signal or deriving a further measurement signal from the acquired measurement signal. Accordingly, the method may generate a further view representing a horizontally zoomed section of the further measurement signal. The horizontally zooming of the further view may correspond to the horizontal zooming of the second view.

Summarizing, the present invention provides an assistance for providing a representation of a measurement signal. In particular, two views for an acquired measurement signal are generated. A first view provides an overview of the acquired measurement signal, and a second view provides a horizontally zoomed section of the acquired measurement signal. The zoom window of the zoomed view is automatically set such that a predetermined number of periods are covered by the zoomed view.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A measurement apparatus, comprising:
   a measurement device for acquiring a measurement signal; and
   a processing device for generating a first view representing an overview of the acquired measurement signal and a second view representing a horizontally zoomed section of the acquired measurement signal; and
   an input device for receiving an indication specifying a horizontal position of the second view within the acquired measurement signal,
   wherein the input device comprises a touch display displaying the first view or an input device for moving around the displayed first view,
   wherein the processing device is configured to determine a periodicity of the acquired measurement signal at the position specified by the input device, and to automatically adapt a width of the second view or a horizontal zoom factor for horizontally zooming the section of the acquired measurement signal in the second view based on the determined periodicity of the acquired measurement signal such that the second view comprises a horizontally zoomed representation of the acquired measurement signal including a signal sequence with a predetermined number of periods of the measurement signal.

2. The measurement apparatus of claim 1, comprising a display for displaying the first view and the second view.

3. The measurement apparatus of claim 1, wherein the second view has a predetermined horizontal width, and wherein the processing device is configured to adapt a horizontal zoom factor based on the predetermined width of the second view.

4. The measurement apparatus of claim 1, wherein the processing device is configured to dynamically adapt a width of the second view based on the periodicity of the acquired measurement signal.

5. The measurement apparatus of claim 1, wherein the processing device is configured to continuously adapt a setting of the second view.

6. The measurement apparatus of claim 1, wherein the processing device is configured to adapt a setting of the second view when a position of the zoomed section of the input signal changes.

7. The measurement apparatus of claim 1, wherein a vertical zoom of the second view is adapted based on a range of the values in the zoomed section of the acquired measurement signal.

8. The measurement apparatus of claim 1, wherein the measurement device is configured to acquire a further measurement signal or to derive a further measurement signal from the acquired measurement signal; and
the processing device is configured to generate a further view representing a horizontally zoomed section of the further measurement signal,
wherein the horizontal zooming of the further view corresponds to the horizontal zooming of the second view.

9. A measurement method, comprising:
acquiring a measurement signal;
generating a first view representing an overview of the acquired measurement signal;
receiving an indication specifying a horizontal position of a second view within the acquired measurement signal by an input device, wherein the input device comprises a touch display displaying the first view or an input device for moving around the displayed first view,
determining a periodicity of the acquired measurement signal at the specified horizontal position; and
generating the second view representing a horizontally zoomed section of the acquired measurement signal,
wherein the second view comprises a horizontally zoomed representation of the acquired measurement signal at the specified horizontal position, and
wherein a width of the second view or a horizontal zoom factor for horizontally zooming the section of the acquired measurement signal in the second view is automatically adapted based on the determined periodicity of the acquired measurement signal such that a horizontally zoomed representation includes a signal sequence with a predetermined number of periods of the acquired measurement signal.

10. The method of claim 9, comprising displaying the first view and the second view on a display.

11. The method of claim 9, wherein the second view has a predetermined horizontal width, and
the method comprises adapting a horizontal zoom factor based on the predetermined width.

12. The method of claim 9, comprising dynamically adapting a width of the second view based on the determined periodicity of the acquired measurement signal.

13. The method of claim 9, comprising adapting a vertical zoom of the second view based on a range of the values in the zoomed section of measurement signal.

14. The method of claim 9, comprising continuously adapting a setting of the second view.

15. The method of claim 9, comprising adapting a setting of the second view when a position of the zoomed section of the input signal changes.

16. The method of claim 9, comprising acquiring a further measurement signal or deriving a further measurement signal from the acquired measurement signal; and
generating a further view representing a horizontally zoomed section of the further measurement signal, wherein the horizontal zooming of the further view corresponds to the horizontal zooming of the second view.

* * * * *